(12) United States Patent
Shim

(10) Patent No.: US 8,216,638 B2
(45) Date of Patent: Jul. 10, 2012

(54) ARRANGING MATERIALS ON A SUBSTRATE

(75) Inventor: Youngtack Shim, Seoul (KR)

(73) Assignee: SNU R&DB Foundation, Seoul (KR)

( * ) Notice: Subject to any disclaimer, the term of this patent is extended or adjusted under 35 U.S.C. 154(b) by 994 days.

(21) Appl. No.: 12/195,330

(22) Filed: Aug. 20, 2008

(65) Prior Publication Data
US 2010/0047446 A1 Feb. 25, 2010

(51) Int. Cl.
*B05D 3/12* (2006.01)
(52) U.S. Cl. ........ 427/240; 427/242; 427/256; 427/286; 118/52; 118/421; 118/426; 118/500
(58) Field of Classification Search .................. 427/240, 427/242, 256, 286; 118/52, 421, 426, 500
See application file for complete search history.

(56) References Cited

U.S. PATENT DOCUMENTS

| | | | |
|---|---|---|---|
| 4,286,443 A * | 9/1981 | Hunter | 68/12.12 |
| 7,772,125 B2 * | 8/2010 | Kawashima et al. | 438/701 |
| 2006/0177568 A1 * | 8/2006 | Hougham et al. | 427/98.3 |

* cited by examiner

*Primary Examiner* — Kirsten Jolley
(74) *Attorney, Agent, or Firm* — Knobbe, Martens, Olson & Bear, LLP

(57) ABSTRACT

Techniques for arranging materials on a substrate are provided. In one embodiment, a system may comprise a driver for providing a rotational force, an outer body having an inner surface, and an inner body having an outer surface and disposed within the outer body in a concentric relationship therewith. The inner body may be coupled to the driver to be rotated by the rotational force. The system may further comprise a coupler attached to the outer body in order to retain a substrate, which forms at least one patterned groove therein. A fluid channel, which may be defined between the inner and outer bodies, may be filled with a fluid medium containing materials such as nano materials. When the inner body rotates via the rotational force, the materials contained in the fluid medium may be arranged in the patterned groove of the substrate.

28 Claims, 6 Drawing Sheets

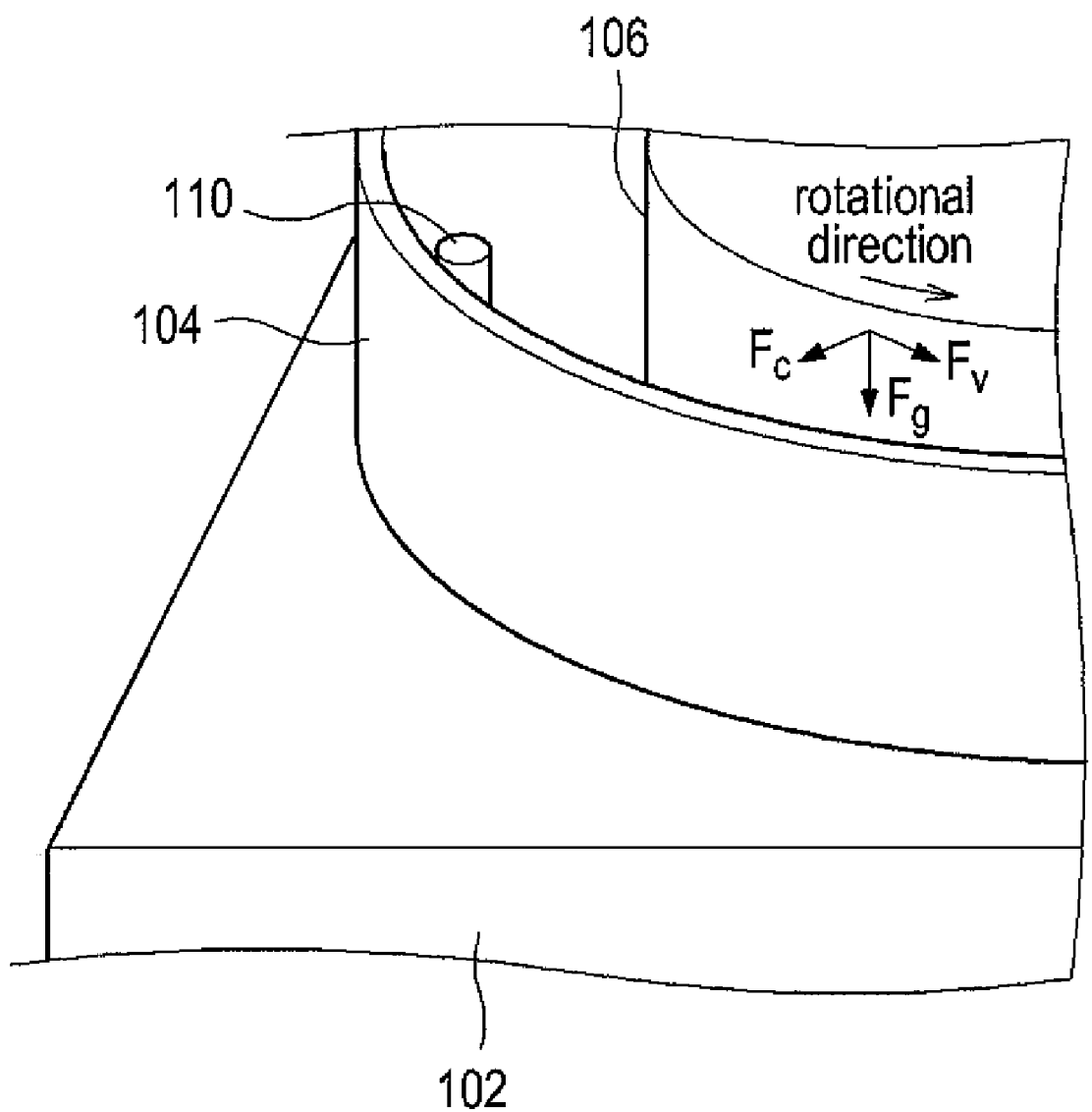

ARRANGING MATERIALS ON A SUBSTRATE

BACKGROUND

One of the principal themes in the field of nanotechnology is the development of nano materials on an atomic or molecular scale (i.e., smaller than a micron). New or preeminent properties of the nano materials are attributed to their nanoscale size. Compared to macroscale materials, the materials reduced to nanoscale display very different properties, which enable them to be adapted for various applications. For example, an opaque substance of macroscale may become a transparent substance of nanoscale, a stable substance of macroscale may turn into a combustible substance of nanoscale, a solid substance of macroscale may be converted into a liquid substance of nanoscale at room temperature, and an insulator of macroscale may become a conductor of nanoscale. Due to such novel properties, the nano materials have been widely applied in various fields.

However, despite their superior mechanical, chemical and electrical properties, there have been significant drawbacks in using the nano materials due to the difficulty of arranging such small materials in a useful structure. In order to fully utilize and apply the preeminent properties of the nano materials in various fields, there is a need for a novel system and method which can arrange such materials in a desired arrangement and orientation.

SUMMARY

The present disclosure provides techniques for arranging nano materials on a substrate. In some embodiments, a system may comprise a driver for providing a rotational (or centrifugal) force, an outer body having a preset shape and including an inner circumferential surface, and an inner body having a preset shape and including an outer circumferential surface, wherein the inner body is disposed within the outer body in a concentric relationship therewith. Either or both of the inner and outer bodies may be coupled to the driver and be rotated by a rotational force. The system of the present disclosure may further comprise a coupler attached to the inner circumferential surface of the outer body in order to retain a substrate. The substrate may have at least one patterned groove formed therein. A fluid channel may be defined between the inner and outer bodies. The fluid channel may be filled with a fluid medium containing nano materials with predetermined shapes and sizes. When the driver rotates either or both of the inner and outer bodies and generates the rotational force, the nano materials which are contained in the fluid medium and aligned with the patterned groove of the substrate may enter the groove and be disposed therein.

In one embodiment the outer body may be coupled to the driver and be rotated by the rotational force. The rotation of the outer body may further facilitate the nano materials to be arranged within the patterned groove of the substrate.

In another embodiment, the system of the present disclosure may further comprise a driver housing for enclosing the driver. In addition, the fluid channel may be defined by the inner circumferential surface of the outer body, the outer circumferential surface of the inner body, and a top surface of the driver housing.

In another embodiment, the outer body may further include a bottom surface. The fluid channel may be defined by the inner circumferential surface of the outer body, the outer circumferential surface of the inner body, and the bottom surface of the outer body.

In another embodiment, a first opening may be formed at the top surface of the driver housing, while a second opening may be formed at a center of the bottom surface of the outer body.

In another embodiment, the driver may comprise a rotational shaft having inner and outer shafts extended through the first opening of the top surface of the driver housing.

In another embodiment, the inner shaft may be coupled to the inner body and the outer shaft may be coupled to the outer body.

In another embodiment, the system of the present disclosure may also comprise a ball bearing, which has inner and outer rings, disposed at the second opening of the bottom surface of the outer body.

In another embodiment, the inner ring may be coupled to the inner shaft and the outer ring may be coupled to the outer shaft, wherein the coupling of the inner and outer rings to their respective shafts is air tight.

In another embodiment, the inner body may be generally shaped as a cylinder having a constant radius along its longitudinal axis.

In another embodiment the inner body may generally have a tapered shape, the radius of which either increases or decreases along its longitudinal axis.

In another embodiment the outer body may be generally shaped as a cylinder having a constant radius along its longitudinal axis.

In another embodiment, the outer body may generally have a tapered shape, the radius of which either increases or decreases along its longitudinal axis.

In another embodiment, the fluid medium may include the nano materials in a form of a solution, emulsion, suspension, slurry, and the like.

In another embodiment, the nano materials may include carbon nanotubes, carbon nanowires, nanotubes of other substances, nanowires of other substances, and nano particles of carbon or other materials.

The present disclosure also provides methods of arranging materials on a substrate in a desired pattern. In some embodiments, a method may comprise forming a desired pattern on a substrate, creating a fluid channel defining a preset dimension (e.g., a radius, a width, a depth, and the like), positioning the substrate in the fluid channel, filling the fluid channel with a fluid medium containing nano materials, and causing the fluid medium to be rotated within the fluid channel to thereby arrange the nano materials in a desired pattern.

In one embodiment the step of causing the fluid medium to be rotated may comprise subjecting the fluid medium to a centrifugal force and a viscous force.

In another embodiment, the method of the present disclosure may further comprise arranging the nano materials on the substrate in the desired pattern based on a vector sum of the centrifugal and viscous forces.

In another embodiment, the step of causing the fluid medium to be rotated may comprise controlling a direction and a velocity of the rotation of the fluid medium while considering the resultant centrifugal and viscous forces.

In another embodiment, the step of causing the fluid medium to be rotated may comprise controlling a direction and a velocity of the rotation of the fluid medium while considering the resultant centrifugal and viscous forces in view of a gravitational force.

In another embodiment, the nano materials may include any materials of which lengths, widths or thicknesses are in a nano scale.

In another embodiment, the predetermined materials may include carbon nanotubes, carbon nanowires, nanotubes of other substances, nanowires of other substances, and nano particles of carbon or other materials carbon nanotubes or carbon nanowires.

This Summary is provided to introduce a selection of concepts in a simplified form that are further described below in the Detailed Description. The Summary is not intended to identify key or essential features of the claimed subject matter, nor is it intended to be used to limit the scope of the claimed subject matter.

BRIEF DESCRIPTION OF THE DRAWINGS

FIGS. 2A and 2B respectively show top and enlarged partial views of the system shown in FIGS. 1A and (1B).

DETAILED DESCRIPTION

Figure 1A:
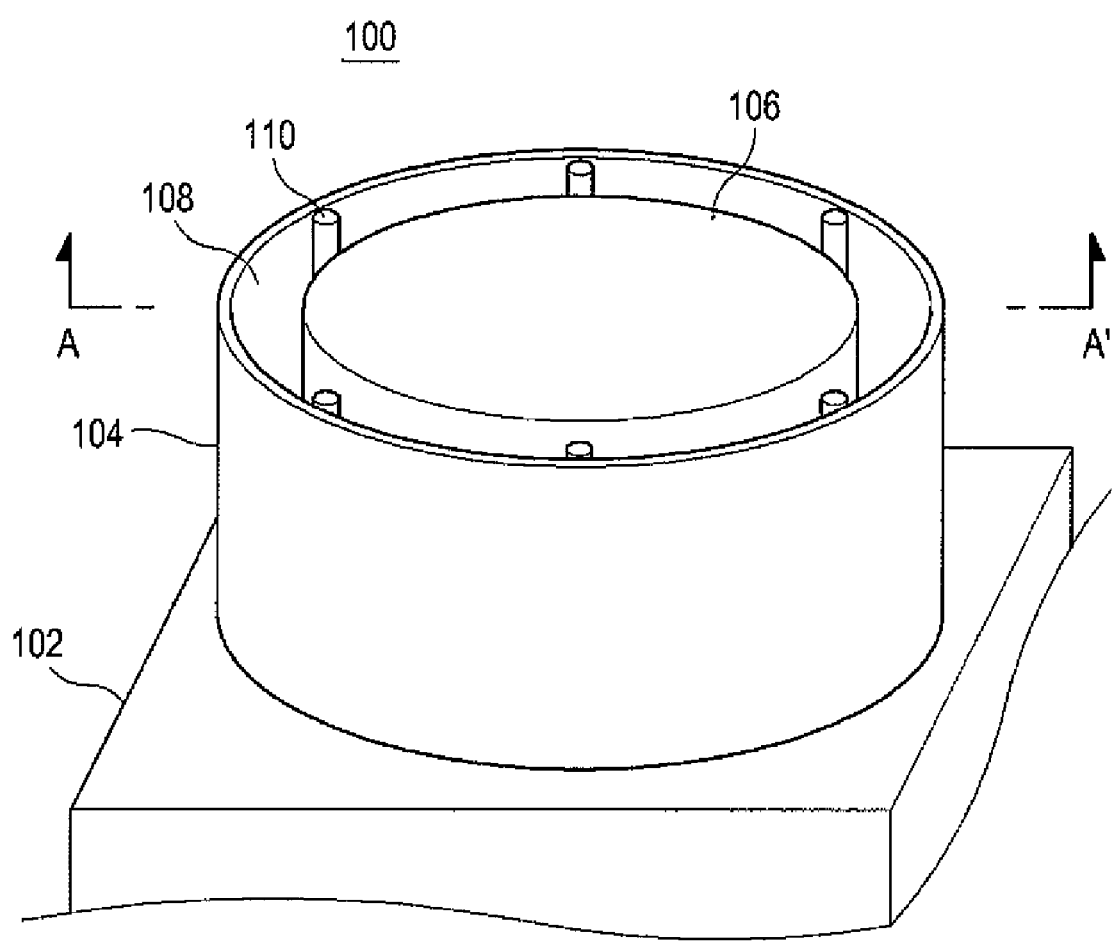
FIGS. 1A and 1B respectively show perspective and cross-sectional views of a system in accordance with one embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the components of the present disclosure, as generally described herein, and illustrated in the Figures, may be arranged, substituted, combined, and designed in a wide variety of different configurations, all of which are explicitly contemplated and make part of this disclosure.

Figure 1B:
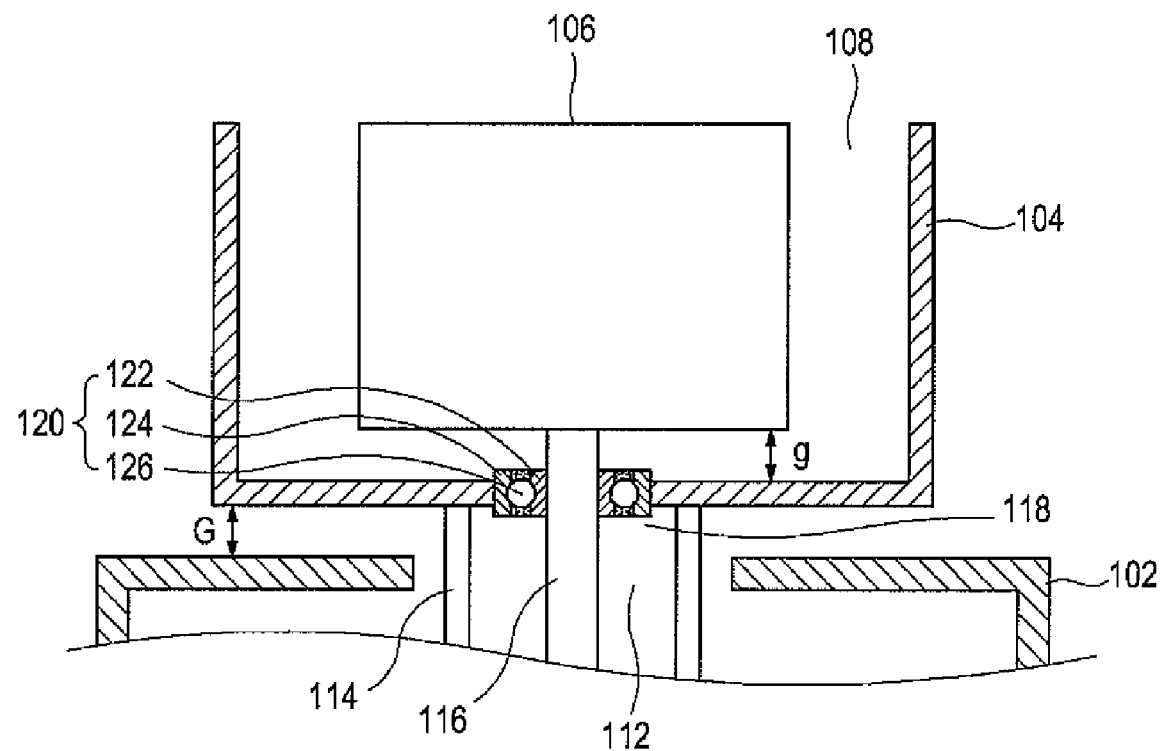

FIGS. 1A and 1B show an illustrative embodiment of a system for arranging nano materials on a substrate. Specifically, FIG. 1A shows a perspective view of the system for arranging nano materials on a substrate, while FIG. 1B shows a cross-sectional view of the system of FIG. 1A taken along the line A-A' of FIG. 1A. As shown in FIG. 1A, the system 100 may include a driver housing 102. The driver housing 102 may be generally shaped as a rectangular box. Further, the driver housing 102 may have a circular opening 112 about a center of its top surface. However, the embodiment shown in FIGS. 1A and 1B is illustrative only and is not intended to be in any way limiting. Accordingly, the shape of the driver housing 102 or the location of the opening 112 may change depending on various features and/or requirements of system operation and/or nano materials. The driver housing 102 may be made from any rigid material which is capable of supporting a structure thereon.

The driver housing 102 may be configured to enclose a conventional motor unit (not shown) therewithin. The motor unit enclosed within the driver housing 102 may include at least one conventional AC motor or DC motor respectively having a rotating shaft adapted to generate rotation of an outer body 104 and/or inner body 106 and a control circuit for controlling operations of the motor. In one embodiment, the motor may be a stepping motor which can provide an accurate angular control, although it is contemplated herein that other types of conventional motors may be used as well. The rotating shaft may upwardly extend through the opening of the driver housing 102 from the motor system enclosed within the driver housing 102. In one embodiment, the rotating shaft may have a dual shaft structure including an outer hollow rotating shaft 114 and an inner rotating shaft 116, where the control circuit may allow the motor to rotate either or both of the outer and inner bodies 104, 106.

An outer body 104 may be mounted on the top surface of the driver housing 102. The outer body 104 may be generally shaped as a hollow cylinder with an open top end. Further, the bottom surface of the outer body 104 may have a circular opening 118 formed about its center. As long as it can receive the inner rotating shaft 116, the opening 118 of the bottom surface may be smaller than the opening 112 of the top surface. The outer body 104 may form a concentric relationship with the opening 112 of the top surface. In one embodiment, the bottom surface of the outer body 104 may be fixedly secured on the top surface of the driver housing 104. Alternatively, the outer body 104 may be rotatably disposed above the driver housing 102 and form a predetermined gap G from the top surface of the driver housing 102.

In one embodiment, the outer body 104 may be operatively coupled to the outer hollow rotating shaft 114 extended through the opening 112 of the top surface. The rotating shaft may deliver a rotational force from the motor system to the outer body 104 to rotate the outer body 104 in a desired direction at a desired linear or angular velocity. In another embodiment, a gear mechanism (not shown), which operatively couples the motor system to the outer body 104, may be provided between the bottom surface of the outer body 104 and the top surface of the driver housing 102. The gear mechanism may deliver a rotating force from the motor system to the outer body 104.

In another embodiment, the outer body 104 may have a double-lumen structure including a rotatable part operatively coupled to the motor system and a fixed part connected to the top surface of the driver housing 102. The fixed part may surround the rotatable part so as to protect it against external damage. In another embodiment, the outer body 104 may have a constant radius along its longitudinal axis. Alternatively, the outer body 104 may have a tapered shape, the radius of which either increases or decreases along its longitudinal axis (e.g., a circular truncated cone). The outer body 104 may be made from any rigid, semi-rigid or soft material which is chemically inert to the fluid medium. It is appreciated that the outer body 104 may define other shapes and sizes as long as such a body 104 can perform various intended functions set forth herein.

Further, an inner body 106 may be arranged on the bottom surface of the outer body 104. The inner body 106 may be generally shaped as a cylinder with closed top and bottom ends. In another embodiment, however, the top end of the inner body 106 may be opened. The bottom surface of the inner body 106 may be rotatably disposed in a concentric relationship with the outer body 104 and may form a predetermined gap g from the bottom surface of the outer body 104. In one embodiment, the bottom surface of the inner body 106 may be integrally coupled to the inner rotating shaft 116 extended through the openings 112, 118. By doing so, this may allow the inner body 106 to rotate in a desired direction at a desired linear or angular velocity.

In one embodiment, the inner body 106 may have a constant radius along its longitudinal axis. The radius of the inner body 106 may be smaller than that of the outer body 104. If the outer and inner bodies 104, 106 are generally shaped as a cylinder with a constant radius, then a gap defined between said bodies 104, 106 also has a constant width along the longitudinal direction. Alternatively, the inner body 106 may have a tapered shape, the radius of which either increases or decreases along its longitudinal axis (e.g., a circular truncated cone).

In one embodiment, the inner body 106 may be shorter than the outer body 104. Alternatively, the inner body 106 may be taller than or equally tall as the outer body 104. The circumferential surface of the inner body 106 may be sufficiently rough enough so as to acquire a desired viscous friction against a fluid medium contacting the surface, thereby creating a flow of the fluid medium. Further, the inner body 106 may be made from any rigid, semi-rigid or soft material which is chemically inert to the fluid medium. It is appreciated that the inner body 106 may define other shapes and sizes as long as such a body 106 can perform various intended functions set forth herein.

The system 100 may further include a ball bearing structure 120 to prevent fluid leakage without obstructing the rotation of the inner rotating shaft 116. The ball bearing structure 120 may include inner rings 122, outer rings 124 and balls 126. The ball bearing structure 120 may be provided at the opening of the outer body 104 to surround the inner rotating shaft 116. The outer ring 124 of the ball bearing structure 120 may be fixedly coupled to the circumference of the opening of the outer body 104 in an air tight manner. The inner ring 122 of the ball bearing structure 120 may be coupled to the inner rotating shaft 116. The balls 126 may be coupled between the inner and outer rings 122, 124. The ball bearing structure 120 may further include a shield for covering the ball bearing structure 120 to prevent any leakage of fluid or other contaminants. The shield may be made from metal, rubber, Teflon and the like. The above-described ball bearing structure in combination with the outer and inner bodies 104, 106 may allow a fluid channel 108, which has a preset width, to be defined between the outer and inner bodies 104, 106.

It is noted that the motor may be incorporated in different locations of the system as far as it can rotate either or both of the outer and inner bodies 106, 104 in a desired direction at a desired speed. Accordingly and in one embodiment, the motor can be disposed lateral to the outer and/or inner bodies 106, 104 so that it can directly contact a side of the outer and/or inner bodies 106, 104 and directly rotate such. In another embodiment, the motor may be disposed in another location of the system which is away from the outer and inner bodies 106, 104 but delivers rotational force by the gear or belt.

In operation, a predetermined portion of the fluid channel 108 may be filled with a fluid medium such as water, organic or inorganic solution, etc. The fluid medium may include nano-scale (or micro-scale) materials which are to be arranged on the substrates. In one embodiment, the nano-scale materials or nano materials may be carbon nanotubes or carbon nanowires.

The fluid medium may be selected in view of numerous factors such as physical or chemical properties of the nano materials, lengths or curvatures of the materials, concentrations of the materials, rotational speeds of the driver, and the like. Depending upon chemical and physical characteristics of the nano materials, the fluid medium is provided as a mixture in various states such as, e.g., a solution, an emulsion, a suspension, a slurry, and the like. In addition, a concentration of the nano materials in the medium may also determine the status of the fluid medium. It is appreciated, however, that the fluid medium may be provided in any of the above states and also in any concentration, as long as the rotation of the outer and/or inner bodies 106, 104 can generate a velocity gradient in the fluid medium.

As shown in FIG. 1A, one or more couplers 110 are disposed on the inner circumferential surface of the outer body 104. Each of the couplers 110 may be configured to engage and retain at least one substrate. In one embodiment, the couplers 110 may have one or more concave or convex structures, which can couple to corresponding structures provided on back surfaces of the substrates. The couplers 110 may be spaced apart from each other by a certain distance or angle. In another embodiment, the couplers 110 may be fixedly attached to the inner circumferential surface of the outer body 114. Alternatively, the couplers 110 may be movably attached in order to retain the substrates in various positions or angles. It should be noted that the couplers 110 may be disposed on any location facing the fluid channel 108 as long as they can couple to and releasably retain the substrate.

Figure 2A:
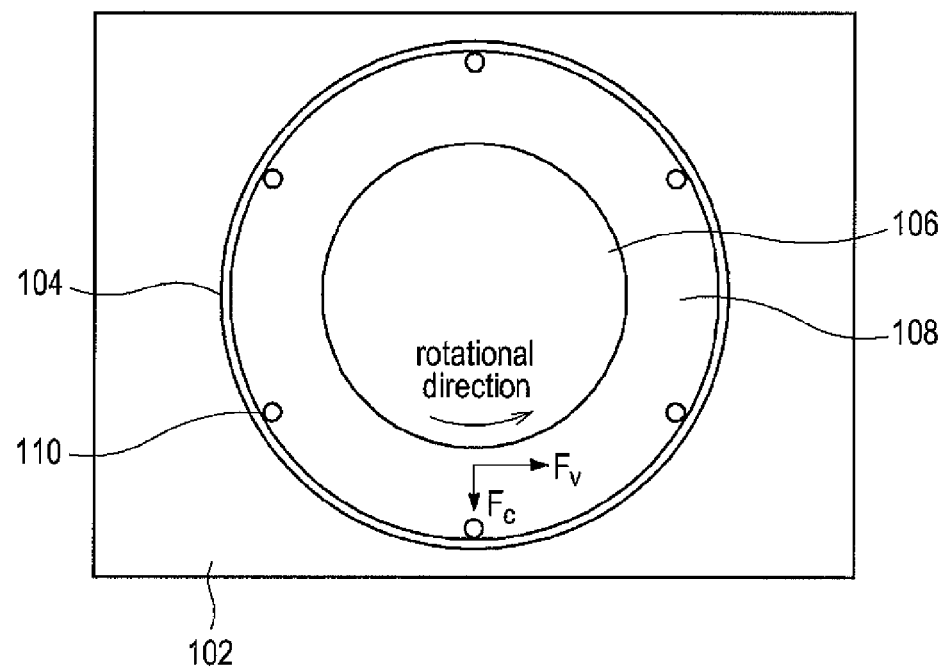

FIGS. 2A and 2B respectively show an illustrative embodiment of top and enlarged partial views of the system shown in FIG. 1A. Specifically, FIG. 2A shows centrifugal and viscous forces exerted on the fluid medium flowing in the fluid channel 108 as well as nano materials included therein when the inner body 106 rotates in a counter-clockwise direction. Further, FIG. 2B shows a relationship centrifugal, viscous, and gravitational forces exerted on the fluid medium flowing in the fluid channel 108 as well as the nano material included therein. As shown in FIG. 2A, the fluid medium may flow in the fluid channel 108 in a counter-clockwise direction while the inner body 106 rotates in the same direction.

Various forces may be applied upon the fluid medium as well as the nano materials. First a centrifugal force denoted by Fc may be generated by the rotational movement of the inner body 106. The centrifugal force may push the fluid medium and nano materials toward the outer body 104. The magnitude of the centrifugal force Fc may be proportional to the rotational speed of the inner body 106, the dynamic or kinematic viscosity of the fluid medium, the mass of the nano material, etc. Because the fluid medium is viscous per se, any momentum associated with the rotational movement of the inner body 106 is gradually transferred to the fluid medium from the outer surface of the inner body 106 to the inner surface of the outer body 104. Therefore, the magnitude of the centrifugal force Fc generated at each location within the fluid medium may typically be inversely proportional to a distance measured from the center of the rotation to the respective location. Thus, when the inner body 106 rotates, the magnitude of the centrifugal force Fc generated near the surface of the inner body 106 may be greater than the magnitude of the centrifugal force Fc generated near the inner surface of the outer body 104.

As the inner body 106 rotates, the fluid medium may flow along the fluid channel 108 as a laminar flow. A boundary layer may be formed near the surface of the inner body 106 contacting the fluid medium. Due to the laminar flow, the momentum from the boundary layer, which is closer to the inner body 106, may be transferred to an adjacent fluid layer toward the outer body 104. Thus, the fluid medium may be affected by a viscous force Fv exerted by the surface of the inner body 106. The viscous force may propagate from the boundary layer toward the outer body 104. The nano materials included in the fluid medium may be aligned along stream lines of the fluid medium affected by the viscous force Fv and such alignment is more prominent with the nano materials such as carbon nanotubes which define elongated shapes. In this regard, it should be noted that the centrifugal force Fc may act in a radial direction, while the viscous force Fv may act in a circumferential direction which is substantially perpendicular to the direction of the centrifugal force Fc.

Further, when the inner body 106 rotates, the magnitude of the viscous force Fv generated at the boundary layer, which is near the surface of the inner body 106, may be greater than the magnitude of the viscous force Fv generated near the outer body 104. In addition, as shown in FIG. 2B, the fluid medium flowing in the fluid channel 108 may be farther affected by a gravitational force Fg. The gravitational force Fg may urge the fluid medium and the nano materials contained therein in a downward direction.

As described above, the nano materials in the fluid medium may be affected by the centrifugal force Fc, the viscous force Fv and the gravitational force Fg. Thus, a moving trajectory and a velocity profile of the fluid medium may be determined by a vector sum of said forces. In one embodiment where the motor in the driver housing 102 rotates the inner body 106 in the clockwise or counter-clockwise direction while the outer body 104 remains stationary, the fluid medium as well as the nano materials included therein may develop a velocity profile attaining its maximum value at the outer surface of the inner body 106, decreasing therefrom toward the outer body 104, and reaching the minimum value (i.e., 0 when no slip condition holds) at the inner surface of the outer body 104. In another embodiment where the motor rotates only the outer body 104 either in the clockwise or counter-clockwise direction while the inner body 106 remains stationary, the fluid medium as well as the nano materials may develop a velocity profile attaining its maximum value at the inner surface of the outer body 104, decreasing therefrom toward the inner body 106, and reaching the minimum value at the outer surface of the inner body 106. The motor can also rotate the outer and inner bodies 104, 106 at the same time in opposite directions, although it is feasible to rotate such 104, 106 in the same direction but at different angular velocity. Regardless of the rotation directions and selection of which body to rotate, the fluid medium and nano materials then begin to rotate around the inner body 206 and become subject to the centrifugal force.

In operation, an operator may manipulate the trajectory and velocity of the fluid medium and the nano materials contained therein by varying the magnitudes of the centrifugal force Fc, where the viscous force Fv is decided by the dynamic viscosity of the fluid and where the gravitational force depends on the mass (or density) of the fluid medium and nano materials. When Fc is greater than Fv and Fg, the fluid medium and the nano materials may travel to the outer body 104 in a trajectory substantially horizontal to the ground and substantially normal to the inner body 106. When Fv is significantly greater than Fc and Fg, the fluid medium and the nano materials may travel toward the outer body 104 in a trajectory winding the inner body 106. When Fc and Fv are significantly less than Fg, the fluid medium and the nano materials may tend to fall vertically to a bottom of the channel. Therefore, an operator can obtain a desirable trajectory of the nano materials by various means such as, e.g., manipulating operation parameters such as a speed of rotation, a gap between the outer and inner bodies 104, 106, and the like, selecting the fluid medium as well as nano materials each having desired material properties such as dynamic viscosities, densities, kinematic viscosities, and the like.

Figure 3A:
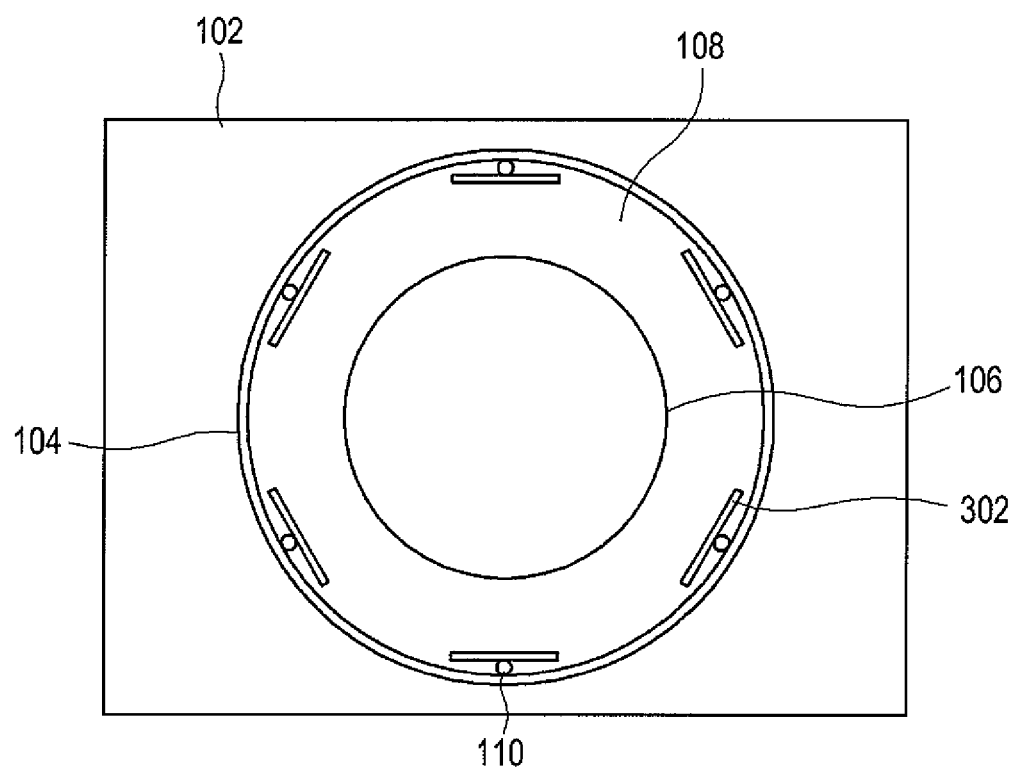
FIG. 3A shows a top view of a system having a plurality of substrates in accordance with one embodiment.
Figure 3B:
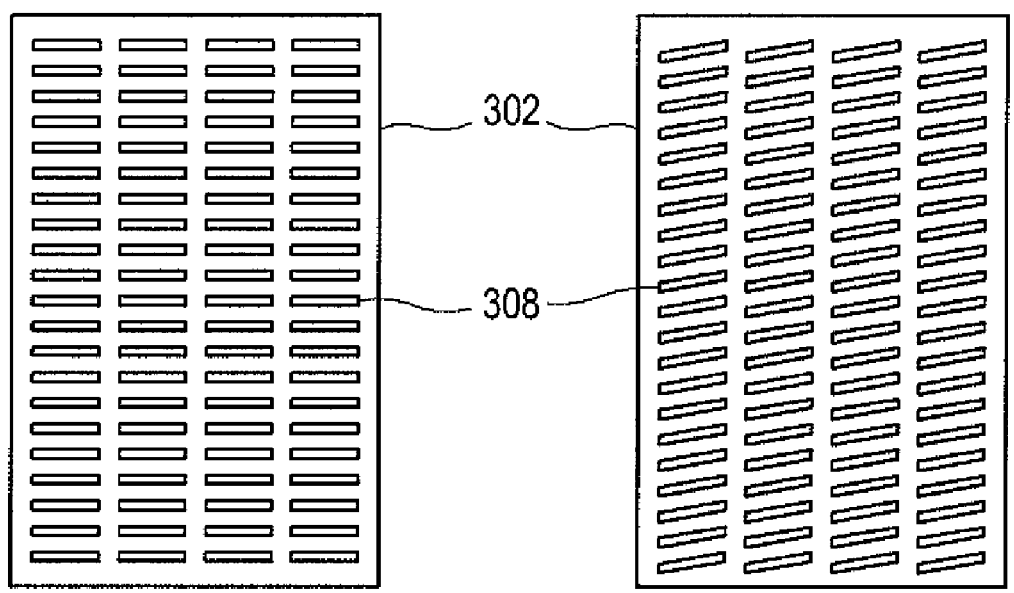
FIG. 3B shows a top view of the substrates shown in FIG. 3A.

FIGS. 3A and 3B respectively show an illustrative embodiment of a system in which a plurality of substrates are mounted on couplers of an outer body of the system and exemplary surface patterns of said substrates. Specifically, as shown in FIG. 3A, substrates 302 may be circumferentially mounted on the couplers 110 in a radial direction or at an acute angle with respect to the radial direction. However, although the substrates may be disposed on the outer body 104 as shown in FIG. 3A, it should be noted herein that the present disclosure is not limited to such an arrangement. Accordingly, the substrates may be disposed on the outer surface of the inner body 106, may be disposed between the outer and inner bodies 104, 106, and the like.

FIG. 3B shows two exemplary surface patterns of the substrates 302 disposed on the inner surface of the outer body 104. It should be noted that the surface patterns of the substrates 302, which are shown in FIG. 3B, are illustrative only and are not intended to limit the scope in any way. The substrates 302 disposed on the inner surface of the outer body 104 may have identical or different patterns. Further, the substrates 302 may have a generally rectangular shape. However, the substrates 302 are certainly not limited to such shape. For example, the substrates 302 may have a generally circular or oval shape.

In one embodiment, the substrates 302 may have a desired pattern including various grooves into which the nano materials may be deposited. As shown in FIG. 3B, multiple grooves 308 are defined on the substrates 302. The grooves 308 may be aligned parallel to the top and bottom edges of the substrates 302. However, in another embodiment, the grooves 308 may be aligned in a preset angle with respect to the top and bottom edges of the substrates 302. The nano materials may be deposited into the grooves on the surfaces of the substrates when the nano materials contained in the fluid medium are aligned with such grooves.

In operation, the inner body 106 may begin to rotate upon being powered by the motor system provided within the driver housing 102. As such, the nano materials flowing with the fluid medium may collide with the surfaces of the substrates 302 disposed on the outer body 104. The fluid medium and the nano materials contained therein may flow from the boundary surface, which is near the surface of the inner body 106, to the surface of the outer body 104 so as to reach the surfaces of the substrates 302. Thereafter, the nano materials, which collide with the surfaces of the substrates 302, may penetrate into the grooves 308 of the substrates 302. In such a case, depending on the shape or size of the grooves 308, the amount of nano materials entering the grooves 308 may vary. In particular, the nano materials entering the grooves 308 are confined to those which are aligned with the grooves 308, while the nano materials not aligned with the grooves 308 would bounce off the grooves 308. Accordingly, the system 100 allows the substrate 302 to collect the nano materials in a desired arrangement. In addition, the nano materials which are longer than the grooves 308 would bounce back to the fluid medium even when one end of each of such nano materials may land into the grooves 308, for the viscous shear would drag the remaining portions of the nano materials out of the grooves 308. Accordingly, the system 100 allows the substrate 308 to collect not only the nano materials aligned therewith but also the nano materials having lengths not exceeding those of the grooves 308.

After the nano materials are deposited into the grooves, the motor system provided within the driver housing 102 may be deactivated. The substrates 302 may be removed either before or after the fluid medium is dispensed from the fluid channel 108. In one embodiment, a protection layer may be provided on the grooves to prevent any inadvertent loss of nano materials from the grooves 308 of the substrates 302. The protection layer may include at least one inert, conductive or semi-conductive material which is well known in the art. In another embodiment, the substrate 302 may be moved into a conventional fab chamber for further processing of the nano materials.

The present disclosure provides efficient and economical system and method for arranging nano (or micro) materials. According to the present disclosure, the nano materials contained in the fluid medium may travel on the surface of the substrates to a direction slightly oblique thereto for a relatively long time. This may also facilitate a greater amount of nano materials to be arranged in a desired pattern on the substrates 302. According to the present disclosure, the nano materials may be arranged on a substrate in a desired pattern with improved efficiency and precision by manipulating the centrifugal, viscous and gravitational forces, which are orthogonal to each other.

In light of the present disclosure, those skilled in the art will appreciate that the methods described herein may be implemented in hardware, software, firmware, middleware or combinations thereof and utilized in systems, subsystems, components or sub-components thereof. For example, a method implemented in software may include a computer code to perform the operations of the method. This computer code may be stored in a machine-readable medium, such as a processor-readable medium or a computer program product, or transmitted as a computer data signal embodied in a carrier wave, or a signal modulated by a carrier, over a transmission medium or communication link. The machine-readable medium or processor-readable medium may include any medium capable of storing or transferring information in a form readable and executable by a machine (e.g., by a processor, a computer, etc.).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of arranging nano materials on a substrate in a desired pattern, comprising:
    forming a desired pattern on the substrate;
    creating a substantially circular fluid channel;
    placing the substrate in the fluid channel;
    filling the fluid channel with a fluid medium containing the nano materials; and
    causing the fluid medium to be rotated within the fluid channel to thereby arrange the nano materials in the desired pattern, wherein the nano materials in the desired pattern are generally aligned,
    wherein causing the fluid medium to be rotated comprises subjecting the fluid medium to a centrifugal force and a viscous force, wherein either the viscous force is greater than the centrifugal force, or a gravitational force on the fluid medium is greater than the centrifugal force.

2. The method of claim 1, further comprising aligning the materials on the substrate in the desired pattern based on a vector sum of the centrifugal and viscous forces.

3. The method of claim 1, wherein the nano materials comprise one or more of carbon nanotubes and carbon nanowires.

4. The method of claim 1, wherein the substrate comprises a plurality of grooves generally aligned on the substrate.

5. The method of claim 1, wherein causing the fluid medium to be rotated comprises causing the fluid medium to be rotated such that a fluid flow in the channel corresponds to laminar flow.

6. A method comprising:
    disposing a substrate in a fluid, wherein the fluid comprises nano materials dispersed within the fluid; and
    rotating the fluid relative to an inner body while the substrate is disposed in the fluid such that the fluid flows over a surface of the substrate effective to promote attachment of at least a portion of the nano materials to the surface of the substrate, wherein the inner body is at least partially disposed in the fluid, and wherein rotating the fluid relative to the inner body comprises subjecting the fluid to a centrifugal force and a viscous force, wherein either the viscous force is greater than the centrifugal force, or a gravitational force on the fluid medium is greater than the centrifugal force.

7. The method of claim 6, wherein the fluid is disposed between the inner body and an outer body, and wherein rotating the fluid comprises rotating one of the inner body or the outer body, while maintaining the other of the inner body and outer body is in a substantially stationary position.

8. The method of claim 6, wherein the fluid is disposed between the inner body and an outer body, and wherein rotating the fluid further comprises rotating the outer body relative to the inner body.

9. The method of claim 8, wherein rotating the fluid further comprises rotating the outer body in a first direction and rotating the inner body in a second direction that is different direction from the first direction.

10. The method of claim 6, wherein rotating the fluid comprises rotating the fluid relative to the inner body such that the fluid flow corresponds to laminar flow.

11. The method of claim 6, wherein rotating the fluid comprises rotating the fluid such that the fluid flows over a surface of the substrate effective to promote attachment of at least a portion of the nano materials to the surface of the substrate generally aligned in a direction of the fluid flow.

12. The method of claim 6, wherein rotating the fluid comprises rotating the inner body about an axis of the inner body such that the fluid flow is about the axis of the inner body.

13. The method of claim 6, wherein the inner body is generally shaped as one or more of a cylinder or a truncated cone.

14. The method of claim 6, wherein the substrate comprises a plurality of grooves generally aligned on the substrate.

15. The method of claim 6, wherein the nano materials comprise one or more of carbon nanotubes and carbon nanowires.

16. The method of claim 6, wherein disposing the substrate further comprises disposing a plurality of substrates in the fluid.

17. The method of claim 6, wherein the viscous force extends generally tangential to an outer surface of the inner body.

18. The method of claim 6, wherein the viscous force is generally perpendicular to the centrifugal force.

19. The method of claim 6, wherein the viscous force is greater than the centrifugal force and the gravitational force.

20. The method of claim 6, wherein the gravitational force is greater than the centrifugal force and the viscous force.

21. A method comprising:
    providing an apparatus comprising:
        an outer body;
        an inner body disposed within the outer body, wherein the inner body is rotatably coupled to the outer body; and
        a fluid channel disposed as least partially between the outer body and the inner body;

disposing a fluid in the channel, wherein the fluid comprises nano materials;

disposing a substrate in the channel; and rotating the fluid relative to the inner body while the substrate is disposed in the channel such that the fluid flows over a surface of the substrate effective to promote attachment of at least a portion of the nano materials to the surface of the substrate, wherein rotating the fluid relative to the inner body comprises subjecting the fluid to a centrifugal force and a viscous force, wherein either the viscous force is greater than the centrifugal force, or a gravitational force on the fluid medium is greater than the centrifugal force.

22. The method of claim 21, wherein the inner body is operably coupled to a driver, and wherein the inner body is rotated via operation of the driver.

23. The method of claim 21, wherein the outer body is operably coupled to a driver, and wherein the outer body is rotated via operation of the driver.

24. The method of claim 21, wherein either the inner body or the outer body is operably coupled to a driver, and wherein operation of the driver is effective to rotate the outer body in an opposite direction relative to the inner body.

25. The method of claim 21, wherein rotating the fluid comprises rotating the inner body about an axis of the inner body such that the fluid flow is about the axis of the inner body.

26. The method of claim 21, wherein the inner body is generally shaped as one or more of a cylinder or a truncated cone.

27. The method of claim 21, wherein the nano materials comprise one or more of carbon nanotubes or carbon nanowires.

28. The method of claim 22, wherein the substrate comprises a plurality of grooves generally aligned on the substrate.

* * * * *

UNITED STATES PATENT AND TRADEMARK OFFICE
CERTIFICATE OF CORRECTION

| | | |
|---|---|---|
| PATENT NO. | : 8,216,638 B2 | Page 1 of 1 |
| APPLICATION NO. | : 12/195330 | |
| DATED | : July 10, 2012 | |
| INVENTOR(S) | : Shim | |

It is certified that error appears in the above-identified patent and that said Letters Patent is hereby corrected as shown below:

In Column 1, Line 53, delete "embodiment" and insert -- embodiment, --, therefor.

In Column 2, Line 22, delete "embodiment" and insert -- embodiment, --, therefor.

In Column 2, Line 25, delete "embodiment" and insert -- embodiment, --, therefor.

In Column 2, Line 47, delete "embodiment" and insert -- embodiment, --, therefor.

In Column 6, Line 11, delete "114." and insert -- 104. --, therefor.

In Column 6, Line 30, delete "First" and insert -- First, --, therefor.

In Column 7, Line 6, delete "farther" and insert -- further --, therefor.

In Column 9, Line 60, in Claim 3, delete "and" and insert -- or --, therefor.

Signed and Sealed this
Ninth Day of October, 2012

David J. Kappos
*Director of the United States Patent and Trademark Office*